United States Patent
Kohli

(10) Patent No.: US 10,535,416 B2
(45) Date of Patent: Jan. 14, 2020

(54) AUTOMATIC TEST-PATTERN GENERATION FOR MEMORY-SHADOW-LOGIC TESTING

(71) Applicant: STMicroelectronics International N.V., Schiphol (NL)

(72) Inventor: Nishu Kohli, Uttar Pradesh (IN)

(73) Assignee: STMicroelectronics International N.V., Schiphol (NL)

( * ) Notice: Subject to any disclaimer, the term of this patent is extended or adjusted under 35 U.S.C. 154(b) by 156 days.

(21) Appl. No.: 15/723,913

(22) Filed: Oct. 3, 2017

(65) Prior Publication Data

US 2018/0025787 A1 Jan. 25, 2018

Related U.S. Application Data

(62) Division of application No. 14/640,601, filed on Mar. 6, 2015, now Pat. No. 9,812,219, which is a division of application No. 13/175,530, filed on Jul. 1, 2011, now Pat. No. 9,003,255.

(51) Int. Cl.
| | |
|---|---|
| *G11C 29/10* | (2006.01) |
| *G11C 29/24* | (2006.01) |
| *G11C 29/00* | (2006.01) |
| *G11C 29/14* | (2006.01) |
| *G11C 29/54* | (2006.01) |
| *G11C 29/52* | (2006.01) |
| *G11C 29/50* | (2006.01) |
| *G11C 29/56* | (2006.01) |
| *G11C 11/34* | (2006.01) |
| *G11C 11/22* | (2006.01) |

(Continued)

(52) U.S. Cl.
CPC ...... *G11C 29/10* (2013.01); *G01R 31/318307* (2013.01); *G01R 31/318371* (2013.01); *G11C 11/2273* (2013.01); *G11C 11/2275* (2013.01); *G11C 11/34* (2013.01); *G11C 11/4063* (2013.01); *G11C 29/00* (2013.01); *G11C 29/14* (2013.01); *G11C 29/24* (2013.01); *G11C 29/50* (2013.01); *G11C 29/52* (2013.01); *G11C 29/54* (2013.01); *G11C 29/56004* (2013.01); *G11C 29/56008* (2013.01); *G01R 31/318342* (2013.01)

(58) Field of Classification Search
CPC . G11C 29/10; G11C 11/2273; G11C 11/2275; G11C 11/34; G11C 11/4063; G11C 29/00; G11C 29/14; G11C 29/24; G11C 29/50; G11C 29/52; G11C 29/54; G11C 29/56004; G11C 29/56008; G01R 31/318307; G01R 31/318371; G01R 31/318342
USPC ........ 714/738, 718, 720, 723; 365/200, 201, 365/203, 208, 230.01, 230.02, 230.08
See application file for complete search history.

(56) References Cited

U.S. PATENT DOCUMENTS

| | | | |
|---|---|---|---|
| 5,519,712 A | * | 5/1996 | Shu .......... G11C 29/38 365/201 |
| 5,544,106 A | | 8/1996 | Koike |

(Continued)

*Primary Examiner* — John J Tabone, Jr.
(74) *Attorney, Agent, or Firm* — Crowe & Dunlevy

(57) ABSTRACT

An embodiment of a method for automated test pattern generation (ATPG), a system for ATPG, and a memory configured for ATPG. For example, an embodiment of a memory includes a first test memory cell, a data-storage memory cell, and a test circuit configured to enable the test cell and to disable the data-storage cell during a test mode.

20 Claims, 6 Drawing Sheets

(51) Int. Cl.
    *G01R 31/3183*    (2006.01)
    *G11C 11/4063*    (2006.01)

(56) References Cited

U.S. PATENT DOCUMENTS

| | | | |
|---|---|---|---|
| 5,555,522 A * | 9/1996 | Anami | G11C 29/24 |
| | | | 365/200 |
| 5,619,462 A | 4/1997 | McClure | |
| 5,745,420 A | 4/1998 | McClure | |
| 5,930,185 A | 7/1999 | Wendell | |
| 5,936,892 A | 8/1999 | Wendell | |
| 6,018,484 A * | 1/2000 | Brady | G11C 29/34 |
| | | | 365/200 |
| 6,052,320 A * | 4/2000 | Kwak | G11C 29/38 |
| | | | 365/201 |
| 6,055,200 A | 4/2000 | Choi et al. | |
| 6,101,618 A | 8/2000 | McClure | |
| 6,216,239 B1 | 4/2001 | Lien | |
| 6,587,979 B1 | 7/2003 | Kraus et al. | |
| 6,643,180 B2 * | 11/2003 | Ikehashi | G11C 29/006 |
| | | | 365/185.09 |
| 6,754,094 B2 | 6/2004 | McClure | |
| 7,136,314 B2 | 11/2006 | You | |
| 7,259,993 B2 | 8/2007 | Redaelli et al. | |
| 7,694,199 B2 | 4/2010 | Whetsel | |
| 8,009,493 B2 | 8/2011 | Na | |
| 8,149,637 B2 | 4/2012 | Hong et al. | |
| 8,369,138 B2 | 2/2013 | Em et al. | |
| 8,427,893 B2 | 4/2013 | Seo | |
| 2002/0040989 A1 * | 4/2002 | Otsuka | G11C 29/12 |
| | | | 257/296 |
| 2006/0041807 A1 | 2/2006 | Terai | |
| 2006/0053356 A1 | 3/2006 | Terai | |
| 2007/0253264 A1 * | 11/2007 | Proell | G11C 7/12 |
| | | | 365/201 |
| 2008/0151668 A1 * | 6/2008 | Kobayashi | G11C 7/02 |
| | | | 365/208 |
| 2008/0259703 A1 * | 10/2008 | Ozbek | G11C 29/24 |
| | | | 365/201 |
| 2009/0073780 A1 | 3/2009 | Kim | |
| 2011/0051541 A1 | 3/2011 | Banno | |
| 2011/0188333 A1 * | 8/2011 | Lee | G11C 7/08 |
| | | | 365/208 |
| 2012/0081942 A1 | 4/2012 | Kurjanowicz | |
| 2012/0187977 A1 | 7/2012 | Hong et al. | |

* cited by examiner

INTERNAL SYNCHRONOUS BYPASS

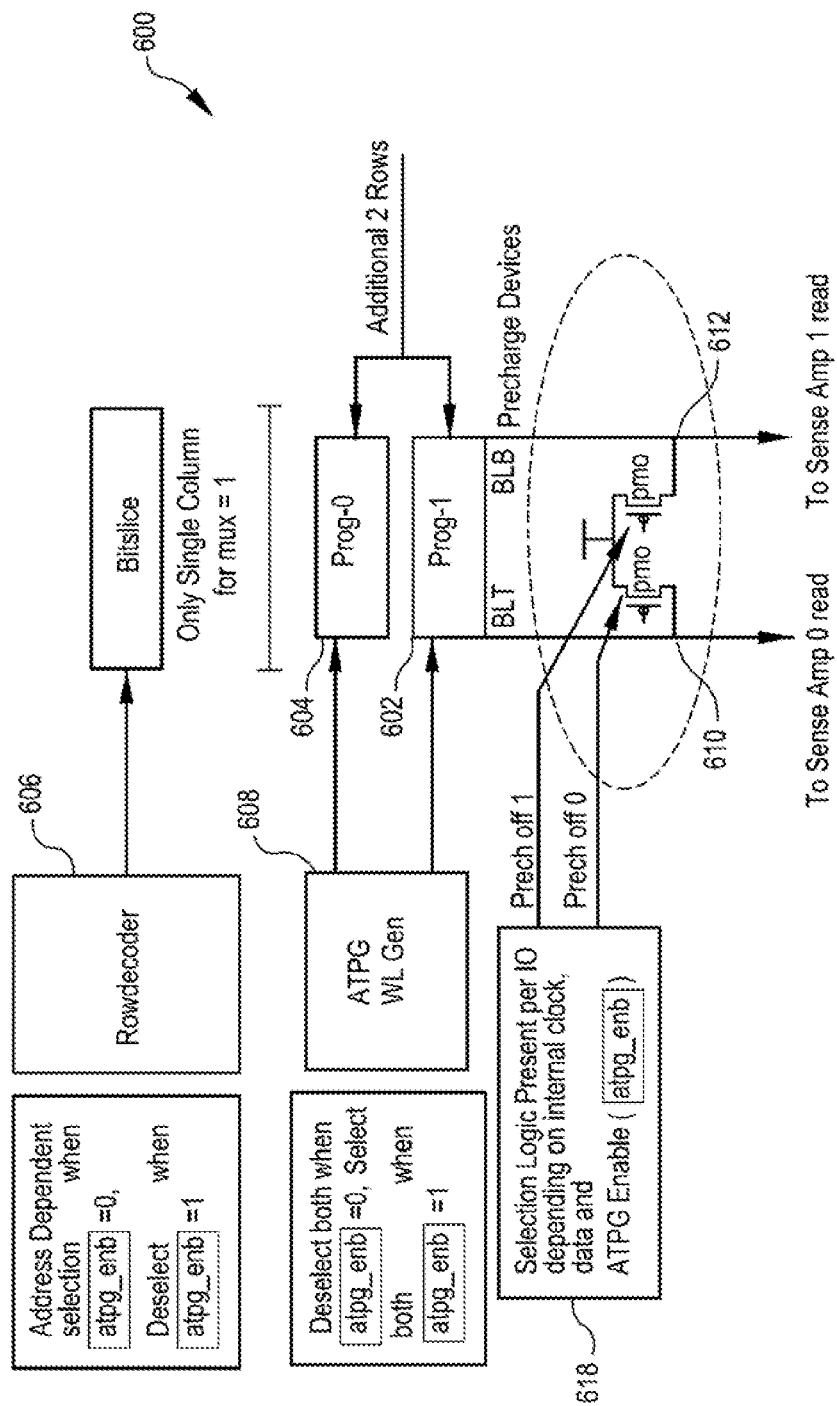

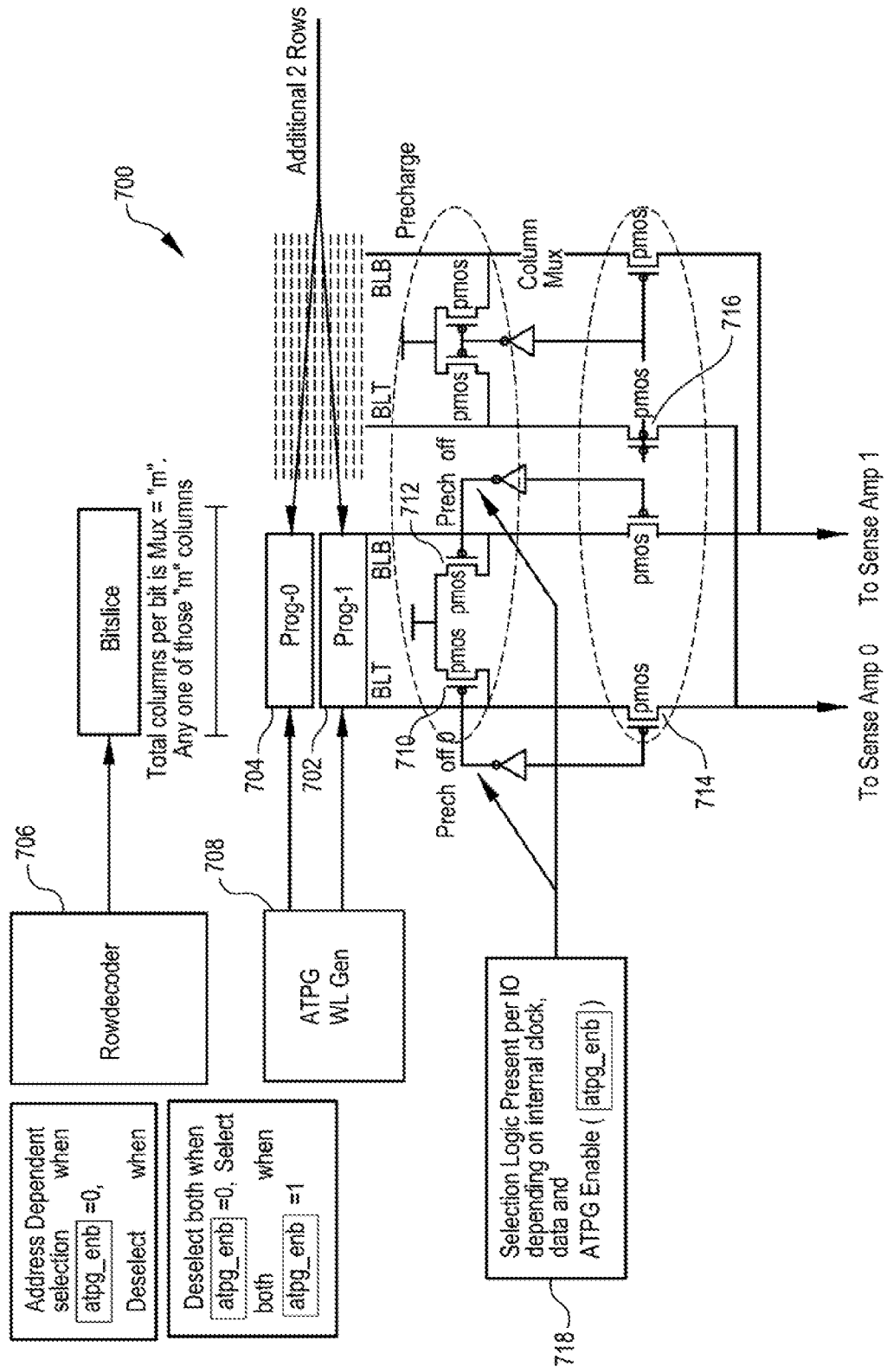

AUTOMATIC TEST-PATTERN GENERATION FOR MEMORY-SHADOW-LOGIC TESTING

CROSS-REFERENCE TO RELATED APPLICATION

This application is a divisional of United States Application for patent Ser. No. 14/640,601 filed Mar. 6, 2015, which is a divisional of United States Application for patent Ser. No. 13/175,530 filed Jul. 1, 2011, the disclosures of which are incorporated by reference.

TECHNICAL FIELD

An embodiment relates to a method and system for automatic test pattern generation (ATPG) for testing of memory shadow logic.

BACKGROUND

ATPG testing is typically used to detect faults, e.g. stuck-at faults, transition faults, in a semiconductor device. Moreover, when the logic to be tested is at the output of a memory, the testing of such logic (called shadow logic from now on) has an associated complexity. FIG. 1 is a block diagram 100 illustrating a simplified test scenario. During an ATPG test mode, in order to get a particular value OR transition on memory output Node2, the most basic way is to perform a write operation of a particular data on a memory address followed by reading it out to get the desired transition. This effectively doubles the number of cycles for each kind of transition on the memory output Node2. To avoid performing a write operation followed by a read operation, some flexibility is allowed to provide the same set of data on the data pins of the memory, as is desired in a particular transition, and make it available at the memory output Node2, hence resulting in the desired value/pattern at the memory output (Node2).

FIG. 2 is a block diagram 200 illustrating a prior art approach for shadow logic testing. In this approach, also known as an external memory bypass implementation, a test pattern generator and a multiplexer MUX are coupled between clock node CK and logic circuit Logic2, independent of logic circuit Logic1 and the memory. Thus, this approach can test the shadow logic at logic circuit Logic2 without accessing the memory, and is capable of detecting stuck-at faults in logic circuit Logic2. However, there is no overall matching between the propagation delay through the test pattern generator (Tdpg) and the actual functional path delay (Taa+Td1). Even if they are reasonably matched under a particular process, voltage, and temperature (PVT) condition, they may be different under different other conditions, thus possibly leading to either under/over-testing with respect to transition faults in shadow logic circuit Logic2. Also, it may not be possible to detect transition faults appearing because of the memory access path (logic circuit Logic1 and Memory). Furthermore, the introduction of the multiplexer MUX on the memory output may not be the most optimum option and may lead to a performance penalty.

FIG. 3 is a block diagram 300 illustrating another prior art approach for shadow logic testing. This approach, also known as the internal asynchronous bypass implementation, is similar to the approach shown in FIG. 2, except that the multiplexer MUX is now inserted into the memory. This approach is also capable of detecting stuck-at faults in shadow logic Logic2, and is somewhat superior to the approach shown in FIG. 2 because the insertion of the multiplexer into the memory is a custom design that results in a lower timing penalty. However, there is still no matching between the propagation delay through ATPG test path (Tdpg+Tdq) and the actual functional path (now Taa+Td1+Tdq). In addition, this approach suffers the other shortcomings as described above with respect to FIG. 2.

FIG. 4 is a block diagram 400 illustrating a memory read access path according to yet another prior art approach. In this approach, also known as the internal-synchronous-bypass approach, a sequential logic delay circuit is coupled between the reference path and the memory IO. The sequential logic delay circuit may be any circuit which waits for the arrival of a clock signal before transmitting the input data to its output, e.g. a flip flop. The clock signal in this case is the sense amplifier enable. This sequential logic delay element is further coupled to a test pattern generator (not shown). The test pattern generator should also ensure setup/hold time of the data inputs with respect to the memory clock signal CK are respected. For example, the signal from the test pattern generator should arrive at the input of the sequential logic delay element slightly before the sense amplifier enable signal from the reference path arrives at its clock input. Here, the access time in ATPG test mode (Taa_atpg) is substantially the same as that in functional mode (Taa), except for the difference between Td1 and T4, where Td1 is the propagation delay through the sequential delay element introduced, and T4 is the sense amplifier reaction time. This approach may also detect stuck-at faults in logic circuit Logic2, and is somewhat better than the approaches described above, e.g. in terms of timing penalty and fault detection. However, the matching of Td1 with T4 is typically difficult under all process conditions as the respective delay mechanisms are very different, i.e. the sense amplifier delay T4 is a latching action, while Td1 is a pure logic delay.

Referring to FIG. 5, in another prior art approach, multiplexers are inserted at the sense amplifier inputs, one on the bitline BL true (BLT) side and another on the bitline BL bar (BLB) side, and no other sequential logic delay element is used. One input of the multiplexer on the BLT input of the sense amplifier receives signal BLT from the memory cell and the other input receives a buffered data signal from the test pattern generator. Similarly, one input of the multiplexer on the BLB input of the sense amplifier receives signal BLB from the memory cell, and the other input of this multiplexer receives the invert of the data generated by the test pattern generator (data bar). The multiplexers are controlled by the "atpg_enable" control pin of the memory, in such a way that in the normal functional mode of the memory (atpg_enable=0), the multiplexers pass BLT and BLB to the respective sense amplifier inputs, while in ATPG test mode (atpg_enable=1), the multiplexers pass the data and data bar inputs generated by the test pattern generator, to the respective sense amplifier inputs. This approach matches all components of the access time in ATPG test mode, except for the dependency of the sense amplifier reaction time (T4) on the voltage differential at the sense amplifier inputs. Typically, during a read operation, the voltage differential available at the sense amplifier input is in the range of few tens of millivolts to a maximum of a couple of hundred of millivolts, depending on the PVT condition. In this prior art approach, it may become difficult to achieve matching between the voltage differential produced by the memory cell during a read operation and that produced by the buffered data and data bar inputs from the test pattern generator. Often, the buffered data produces a full voltage swing at the sense amplifier input, equal or near to the supply voltage, and under this condition, the sense amplifier does not wait for the arrival of a sense amplifier enable signal from the memory reference path, but transmits the buffered data to the output independent of the sense amplifier enable signal, meaning no matching between Taa & Taa_atpg.

SUMMARY

A need therefore exists to provide a method and system for automated test pattern generation that seeks to address one or more of the above-described problems. An embodiment of a memory includes a first test memory cell, a data-storage memory cell, and a test circuit configured to enable the test cell and to disable the data-storage cell during a test mode.

BRIEF DESCRIPTION OF THE DRAWINGS

One or more embodiments will be better understood from the following written description, by way of example only, and in conjunction with the drawings, in which:

FIG. 7 is a block diagram illustrating a design of the memory for ATPG according to an embodiment suitable for memories organized with any column mux, and shown, as an example, in a configuration for column mux=1.

FIG. 8 is a block diagram illustrating a design of the memory for ATPG according to an embodiment suitable for memories organized with any column mux, and shown, as an example, in a configuration for column mux>1.

DETAILED DESCRIPTION

Figure 1:
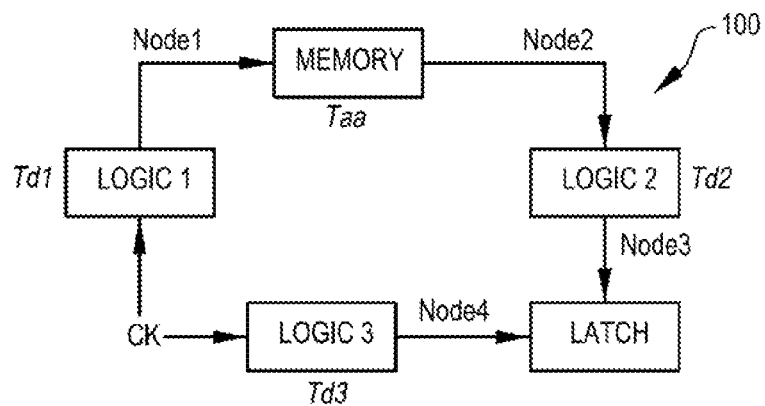
FIG. 1 is a block diagram illustrating a simplified scenario where memory shadow logic is tested through ATPG testing.
Figure 2:
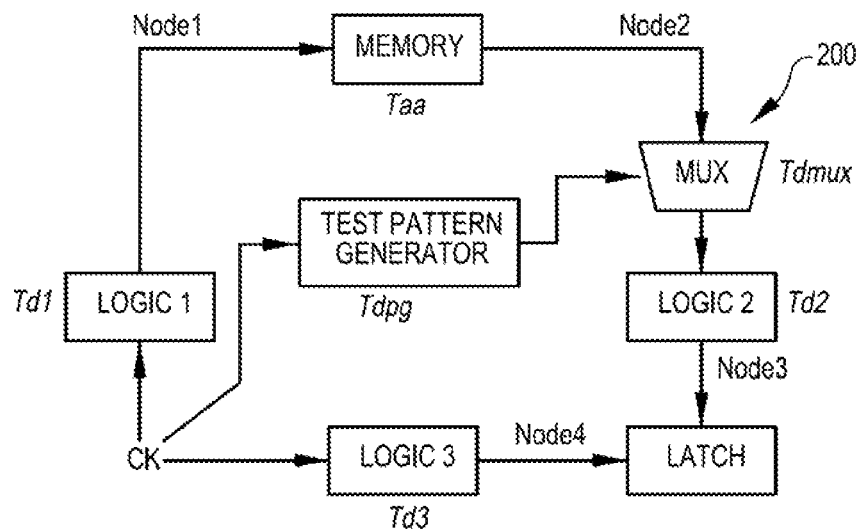
FIG. 2 is a block diagram illustrating a prior art approach for test pattern generation for shadow logic testing.
Figure 3:
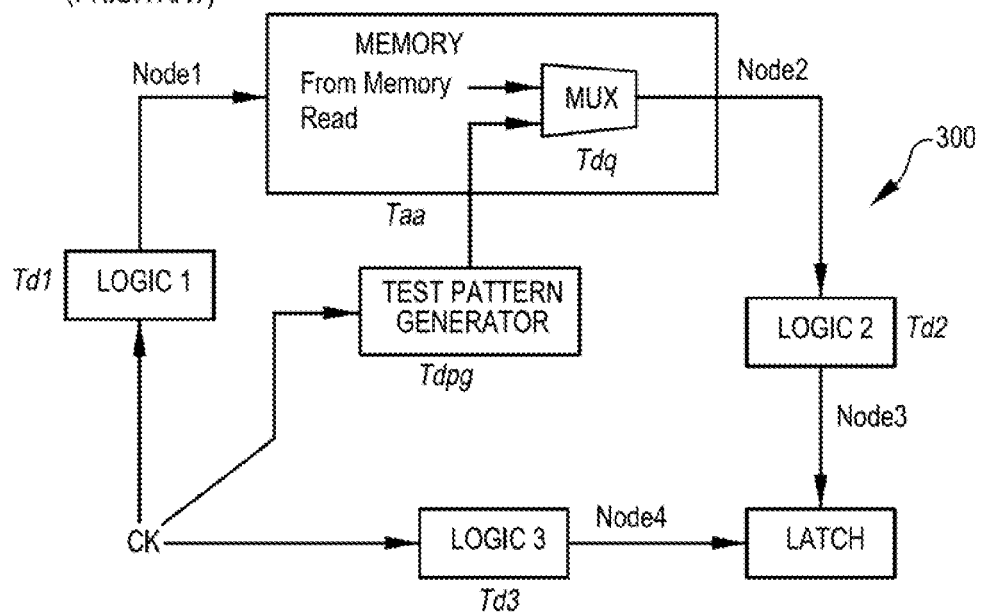
FIG. 3 is a block diagram illustrating another prior art approach for test pattern generation for shadow logic testing.
Figure 4:
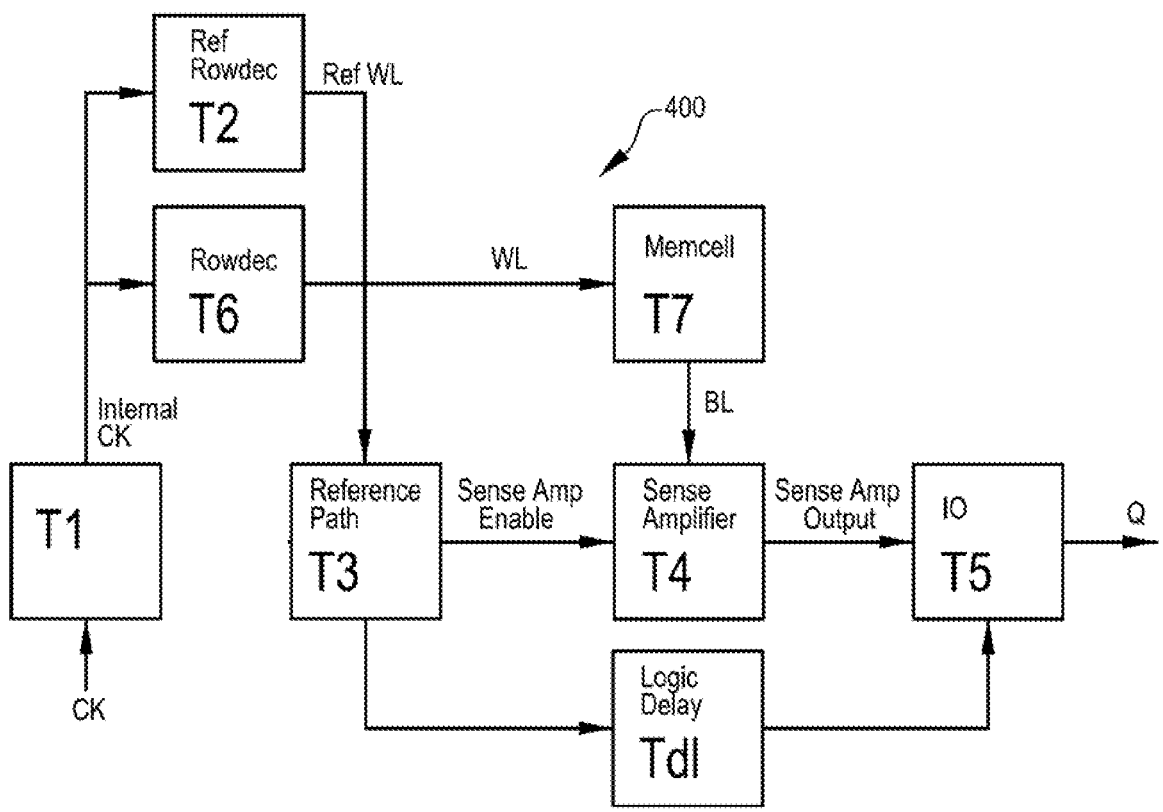
FIG. 4 is a block diagram illustrating another method for test pattern generation for memory shadow logic testing according to yet another prior art approach.
Figure 5:
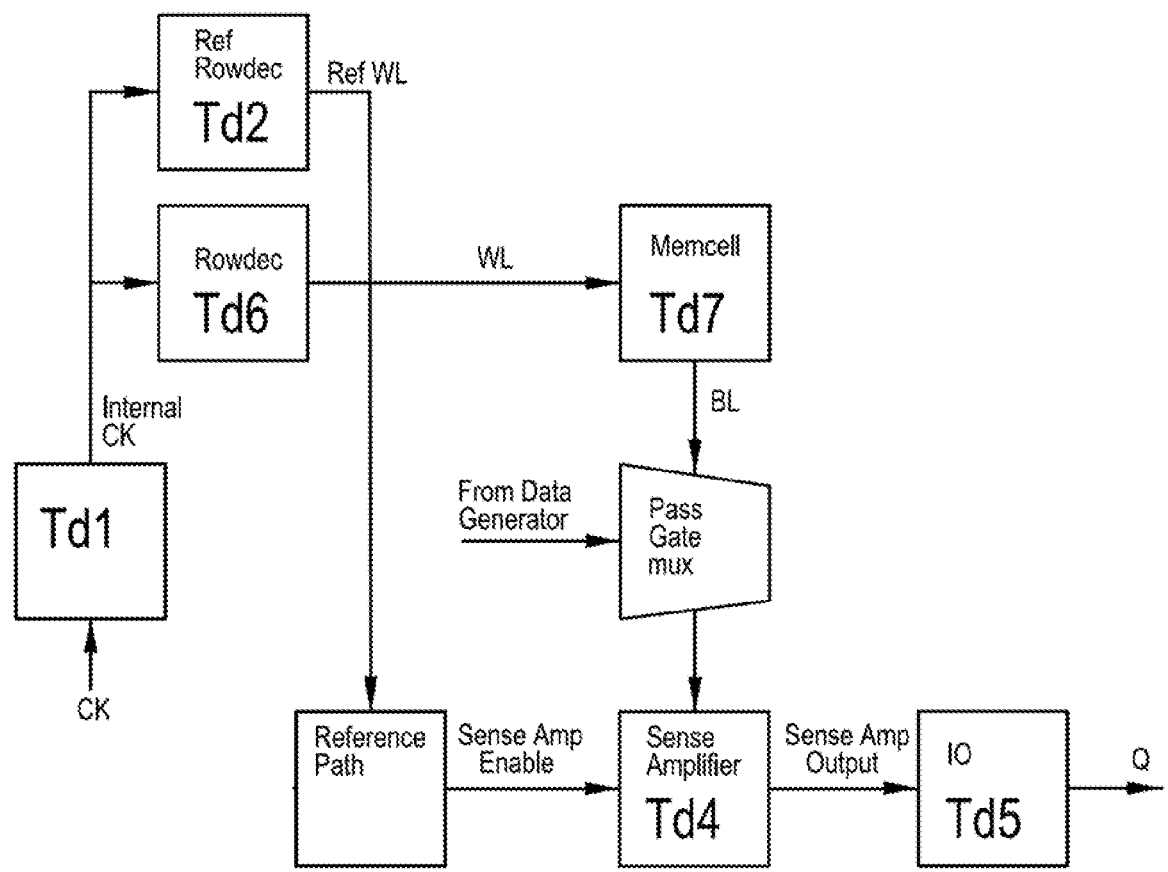
FIG. 5 is a block diagram illustrating another method for test pattern generation for memory shadow logic testing according to yet another prior art approach.

One or more embodiments include methods and systems for ATPG for memory shadow logic testing with an improved matching between memory access time in normal/functional mode (Taa) and that in test mode (Taa_atpg), by activating the entire memory path. In particular, the sense amplifier is included in the Taa_atpg path. This may ensure that the faults in the entire memory path (for the location which is accessed in ATPG mode) get detected/checked. In addition, the voltage differential available at the sense amplifier input at the time of sense amplifier enable arrival may match between normal functional mode and ATPG test mode. Thus, in an embodiment, only the sense amplifier reaction time (T4) may vary with different memory address locations, because of inherent process mismatch, leading to different available voltage differential at the sense amplifier inputs, for different memory address locations. But this variation in T4 with different memory address locations is expected to be low except for certain extreme memory cell occurrences, which may provide extremely low or high voltage differential at the sense amplifier inputs. Such extreme memory cell occurrences typically have a low probability.

An embodiment provides an address in the memory which may provide a voltage differential similar in value to actual address locations in the memory for both logic values 0 and 1 at the sense amplifier input, a mechanism to select the above address location in ATPG test mode, and may also block the actual word line (WL) generation corresponding to the address present at the memory address inputs during ATPG test mode. And an embodiment may also provide a mechanism to select the voltage differential corresponding to either a logic value 0 or 1 at the sense amplifier input as per the desired pattern at the memory output.

According to an embodiment, a method for automated test pattern generation (ATPG) includes generating a test pattern using respective ATPG memory address locations of a memory coupled to a logic circuit under test.

The ATPG memory address locations may include the same word column in two rows of a column mux="m" organized memory, where m≥1.

A memory cell at said column in one of said two row lines may be programmed for program value '0' and a memory cell at said column in the other of said two row lines may be programmed for program value '1'.

Selecting between program value '0' and program value '1' may be controlled by controlling precharge devices coupled to BLT and BLB of the respective memory cells.

Where m>1, selecting between program value '0' and program value '1' may further be controlled by controlling column mux devices coupled to BLT and BLB of the respective memory cells.

Logic levels of the column mux devices may be controlled to be opposite to those of the precharge devices.

Where the memory is organized as a column mux="m", where m>1, the ATPG memory address locations may include different columns in a single row.

A memory cell at one of said different columns may be programmed for program value '0' and a memory cell at the other column may be programmed for program value '1'.

Selecting between program value '0' and program value '1' may be controlled by controlling column mux devices and precharge devices coupled to BLT and BLB of the respective memory cells.

A selection control of the precharge devices may be an inverted version of a selection control of the column mux devices.

An embodiment may include disabling a row decoder of the memory and using an ATPG world line generator for selecting the ATPG memory address locations.

An embodiment may include providing voltage differentials associated with respective ATPG memory address locations to a sense amplifier of the memory for output into the logic under test.

According to an embodiment, a system for automated test pattern generation (ATPG) includes means for generating a test pattern using respective ATPG memory address locations of a memory coupled to a logic circuit under test.

The ATPG memory address locations may include the same column in two rows of a column mux="m" memory, where m≥1.

A memory cell at said column in one of said two row lines may be programmed for program value '0' and a memory cell at said column in the other of said two row lines may be programmed for program value '1'.

A means for selecting between program value '0' and program value '1' may be configured to control precharge devices coupled to BLT and BLB of the respective memory cells.

Where m>1, the means for selecting between program value '0' and program value '1' may further be configured to control column mux devices coupled to BLT and BLB of the respective memory cells.

The means for selecting may be configured such that logic levels of the column mux devices are controlled to be opposite to those of the precharge devices Where the memory is organized as a column mux="m", where m>1, the ATPG memory address locations may include different columns in a single row.

A memory cell at one of said different columns may be programmed for program value '0' and a memory cell at the other column may be programmed for program value '1'.

A means for selecting between program value '0' and program value '1' may be configured to control column mux devices and precharge devices coupled to BLT and BLB of the respective memory cells.

The means for selecting may be configured such that a selection control of the precharge devices is an inverted version of a selection control of the column mux devices.

The system may further include means for disabling a row decoder of the memory and using an ATPG world line generator for selecting the ATPG memory address locations.

The system may further include a sense amplifier of the memory, wherein the sense amplifier is configured to receive voltage differentials associated with respective ATPG memory address locations for output into the logic under test.

According to an embodiment, a memory is configured for automated test pattern generation (ATPG), the memory including ATPG memory address locations for generating a test pattern for ATPG as described above.

Figure 6:
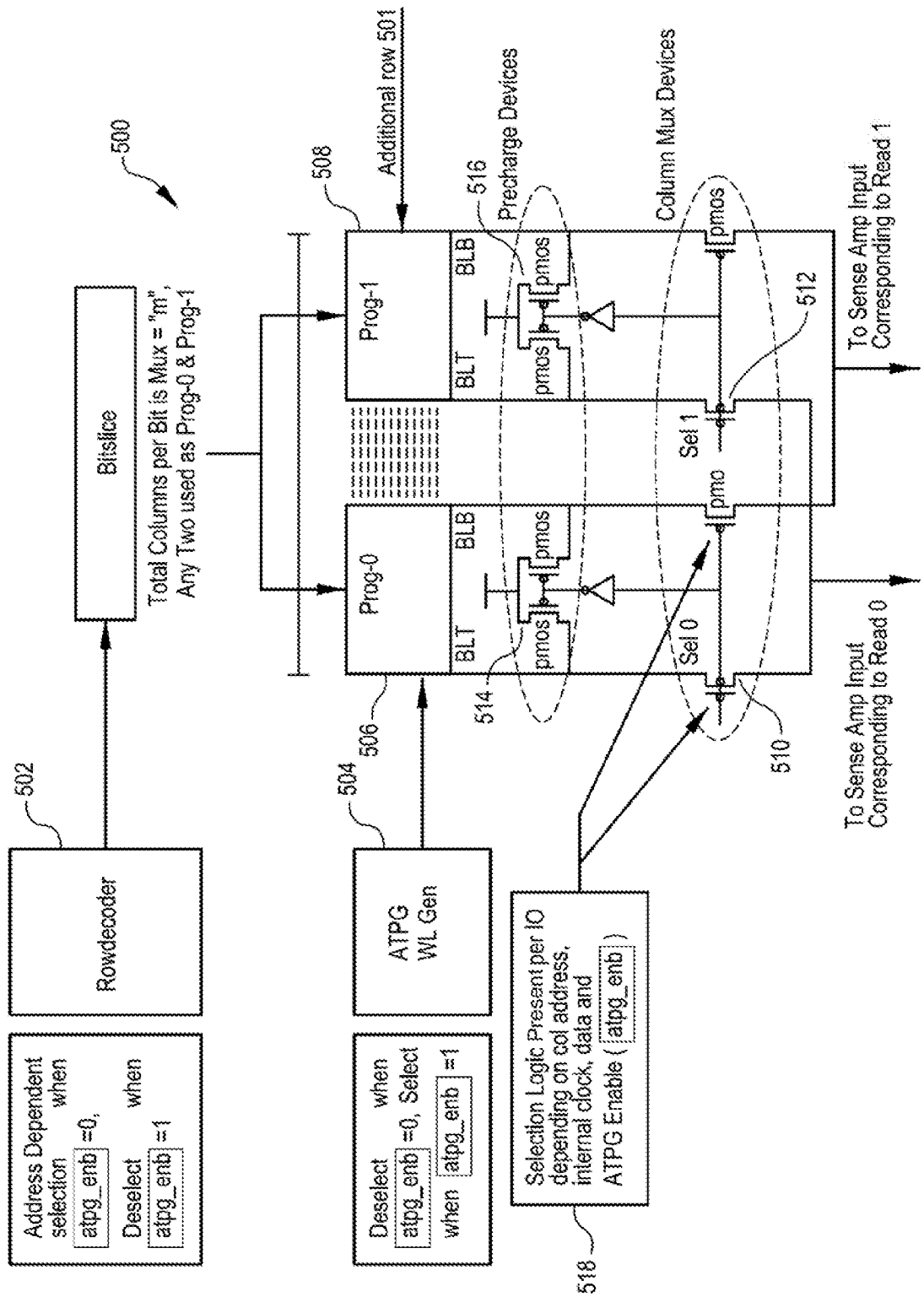
FIG. 6 is a block diagram illustrating a design of the memory for ATPG according to an embodiment suitable for memories organized as a column mux>1.

FIG. 6 is a block diagram 500 illustrating a method and system for automatic test pattern generation (ATPG) for testing of memory shadow logic according to an embodiment that is suitable when the memory is organized as a column mux>1 memory. The column mux is the number of word columns per row of a memory that are selected by any single addressed word line. As an example, a memory with "w" words and "b" bits per word, when organized as a column mux="m", would have "w/m" rows, "b*m" bit columns per row, and m word colums per row, and any word line would enable "m" word columns, or "b*m" bit columns, in the row. In order to select the desired word column, a further selection of any one of the "m" sets of "b" enabled bit lines is done, based on those input address bits which correspond to word-column selection.

In an embodiment, where the memory is organized as column mux="m", an additional row 501 similar to other addressable rows in the memory, including "m*b" columns is disposed in the memory array. Of the "m" available word columns (each word column has "b" bit columns) in this additional row, any two word columns are identified, say "i" and "j" word columns, and each word column is configured for the same program value in each bit of the word column. E.g. word column "i" programmed to "0" for each bit, and word column "j" programmed to "1" for each bit. In the example in FIG. 6, the first two bit columns of each word column are shown to be identified for this programming, i.e. "i"=0 and "j"=1. But as mentioned above, any two of the "m" word columns could be used for programming "0" and "1". The other "m-2" available memory word columns in this additional row are not utilized in an embodiment. This provides an address in the memory which may provide, in conjunction with logic for control of precharge devices 514, 516 and column mux devices 510, 512, a voltage differential for both logic values "0" and "1" at the sense amplifier input for each bit of the word. In FIG. 6, the additional row 501 has been schematically illustrated in the context of a single bit of a word only, i.e. row 501 is illustrated with two bit columns 506, 508 only one bit column for each of the two word columns, for better clarity.

The controlling pin for the desired operation is "atpg_enable". When atpg_enable value is "0" (during normal memory access), an address-dependent select operation is carried out by the row decoder 502 and the ATPG word line generator (ATPG WL Gen, 504) does not select the additional row 501. Also, in this mode, the address bits corresponding to column selection would select one of the "m" word columns and pass the bit columns of this word column to the sense amplifier input. When atpg_enable value is "1" (during ATPG test mode), the row decoder 502 is deselected, thus disabling all the word lines, and the ATPG WL Gen 504 selects the row 501, thus activating all "m" word columns in the additional row 501, including the two programmed word columns 506 and 508. That is, by disabling the row decoder 502 and activating the ATPG WL Gen 504 during a bypass, a mechanism is provided to select the address of the additional row 501, and to block the word line generation corresponding to the address bits of the actual memory. Table I shows the truth table for this logic in the example embodiment:

TABLE 1

| Address | Atpg_enable | Actual Wordline | ATPG Wordline |
|---------|-------------|-----------------|---------------|
| Valid   | 0           | Select based on address | Deselect |
| Xx      | 1           | Deselect All    | Select        |

Further, column mux devices 510, 512 (comprising p-channel metal-oxide-semiconductor (PMOS) transistors in an embodiment) are used to provide a mechanism to select a voltage differential corresponding to either a "0" or "1" value at the sense amplifier (not shown) input based on the desired pattern at the memory output. For each column mux device 510, 512, the selection logic (not shown) present per memory IO depends on the column address, clock, data input for the respective memory IO and on whether ATPG test mode is enabled (e.g. based on the value of atpg_enable). As illustrated in FIG. 6, in an embodiment, the control of the PMOS transistors of precharge devices 514, 516 of the respective word columns is the inverse of the selection control for the PMOS transistors of the word column mux devices 510, 512. Table 2 shows the truth table of the selection logic in this example embodiment.

TABLE 2

| Internal Clock | atpg_enable | Col Adr | Data | Select Col |
|----------------|-------------|---------|------|------------|
| Reset State    | Xxx         | Xxx     | Xxx  | All Unselected |
| Generated      | 0           | <col adr> | Xxx | For <col adr> |
| Generated      | 1           | Xxx     | 0    | Sel 0      |
| Generated      | 1           | Xxx     | 1    | Sel 1      | where Xxx for any input denotes that the "Selected Column" is independent of this input, and Sel 0 and Sel 1 denote selection signals to the respective column mux devices 510, 512 and pre-charge devices 514, 516. Note that the above truth table is effective when memory has accepted a valid clock i.e. the memory internal clock has been generated. Hence, when the memory is in idle state, i.e. the memory internal clock signals have been reset by the memory self timing, both "Sel 0" and "Sel 1" will be maintained at logic level "1", and also other unused columns are deselected, meaning deselection of both word columns 506 and 508, and turning ON of precharge devices 514 and 516. When the valid clock edge has been detected by the memory in ATPG test mode, the signal "Sel 0" will be driven to "0" while maintaining signal "Sel 1" at "1" for a data value of "0" at the data input of any bit, and vice versa for a data value of "1". So for example, for data="0" on any bit, the column mux devices 510 are turned ON and precharge devices 514 are turned off. Also, in the same memory IO, column devices 512 are turned OFF and precharge devices 516 are turned ON. Hence, the BLT corresponding to column 506 discharges, corresponding to the programming of "Prog-0" in the cell 506. Thus the sense amplifier input corresponding to Read 0 will receive the discharging bitline BLT, and the other input of the sense amplifier, corresponding to Read 1 will stay at the precharged value. Hence at the time of arrival of the sense amplifier enable signal, a voltage differential corresponding to Read 0 is created at the sense amplifier inputs, and the value of this voltage differential is similar to the voltage differential which would be created during a functional Read 0 operation. This is further transferred to the output of this memory bit as a 0, by the sense amplifier and the IO logic of this bit. Similarly, for data="1" on any bit, the voltage differential similar in value to the actual Read 1 operation would be created at the sense amplifier input, which would then transfer it as 1 to the output of this memory bit.

The selection logic 518 may be implemented as a simple Boolean logic, according to the truth table as described above. At least one example of the truth table-to-actual logic realization is conventional and, therefore, will not be described herein.

FIG. 7 is a block diagram 600 illustrating a method and system for automatic test pattern generation (ATPG) for testing of memory shadow logic according to an embodiment suitable when memory is organized as column mux=1.

FIG. 8 is a block diagram 700 illustrating an embodiment for the case when memory is organized as column mux>1.

In these embodiments, two additional rows 602, 604 for mux=1 and 702, 704 for mux>1 (corresponding to program values "0" and "1" respectively for each of the "b" bits of a single word) are disposed in the memory, thereby providing an address in the memory which may provide a voltage differential for both logic values "0" and "1", respectively, at the sense amplifier input. For the case of column mux>1 (FIG. 8), any one of the mux="m" word columns in each of these two rows may be used to have the cells corresponding to program values "0" and "1", while the other "m−1" word columns in each of these two rows are not utilized in an embodiment. In FIG. 7 and FIG. 8, the additional rows 602, 604 and 702, 704 have been schematically illustrated in the context of a single bit only for each of rows 602, 604 and 702, 704 for better clarity.

When atpg_enable value is "0" (e.g. during normal memory access), an address-dependent select operation is carried out by the row decoder 606/706 and the ATPG WL Gen 608/708 does not select any of the two rows 602, 604/702, 704. When atpg_enable value is "1" (e.g. during an ATPG test mode), the row decoder 606/706 is deselected and the ATPG word line generator 608/708 selects both rows 602, 604/702, 704. That is, by disabling the row decoder 606/706 and activating the ATPG WL Gen 608/708 during a bypass, a mechanism is provided to select the above address of program values "0" (prog-0) and "1" (prog-1) for each bit of a word, and to block the word line generation corresponding to the address bits. Table 3 shows the truth table for the above implementation:

TABLE 3

| Address | Atpg_enable | Actual Wordline | ATPG Wordline<0:1> |
|---------|-------------|-----------------|---------------------|
| Valid | 0 | Select based on address | Deselect Both |
| Xx | 1 | Deselect All | Select Both |

Further, precharge devices 610, 612/710, 712 (including p-channel metal-oxide-semiconductor (PMOS) transistors in an embodiment) are used to selectively turn off the precharge of the complimentary bitlines BL true (BLT) OR BL bar (BLB) corresponding to read-0 or read-1 independently for each memory IO depending on the data presented on the data input pin of the respective memory IO by the test pattern generator, or to provide a mechanism to select a voltage differential corresponding to either a "0" or "1" value at the sense amplifier (not shown) input based on the desired pattern at the memory output. In case of column mux>1 (FIG. 8), the precharge devices 710, 712 of that word column out of mux="m" word columns which has been used for having the Prog-0 and Prog-1 cells, are controlled in the above fashion. In addition, the column mux devices 714, 716 of the programmed word column are also controlled to have the logic level opposite to that present on the corresponding precharge devices, as shown in FIG. 8. In each column precharge device 610, 612/710, 712 the selection logic present per memory IO depends on the precharge off signal, internal clock, data, and whether ATPG test mode is enabled (based on the logic level of the signal atpg_enable) FIG. 7, and "Precharge off 0" and "Precharge off 1" are the names of the signals driving the gates of the PMOS in the precharge devices 610, 612/710, 712 respectively. Since a PMOS turns on when the gate is driven to logic level "0", it means, that for the memory IO for which a "0" to be read out of the sense amplifier, the signal "Precharge off 0" is driven to "1" in order to turn off the precharge device 610/710, while continuing to drive the signal "Precharge off 1" to "0" so that the precharge device 612 is on. Thus, the bitline corresponding to the precharge device 610/710 (e.g. BL true) would discharge, but the bitline corresponding to the precharge device 612/712 (e.g. BL bar) would not discharge. Hence the sense amplifier (not shown) would read out a "0". Similarly, the driving is performed in the opposite way to read out a "1" from any memory IO. Table 4 shows a truth table of this design.

TABLE 4

| Internal Clock | atpg_enable | Col Adr | Data | Prech Off |
|----------------|-------------|---------|------|-----------|
| Reset State | Xxx | Xxx | Xxx | All ON |
| Generated | 0 | <col adr> | Xxx | For <col adr> |
| Generated | 1 | Xxx | 0 | Prech Off 0 |
| Generated | 1 | Xxx | 1 | Prech Off 1 |

The selection logic 718 may be implemented as a simple Boolean logic, according to the truth table as described above. At least one embodiment of the truth table-to-actual logic realization is conventional, and, therefore, will not be described herein.

A system and method according to an embodiment may provide a full matching between Taa and Taa_atpg, and use an exact memory path corresponding to an actual read operation also in the ATPG test mode, except for the fact that the location of the address used during ATPG testing is different from an actual address during memory read operation. But this location may produce the same voltage differential at the sense amplifier input as would be produced by a normal memory address location during a functional read mode. For example, the timing penalty on the direct path between CK and output Q may be negligible as only a single row or two rows are added and no multiplexer on the output is needed. Furthermore, the area overhead due to additional rows and logic required may be minimal (<3%).

It will be appreciated that numerous variations and/or modifications may be made to the above-described embodiments without departing from the disclosure as broadly described. The described embodiments are, therefore, to be considered in all respects to be illustrative and not restrictive.

One variation relates to an embodiment for the scenario where the memory cell is different from the memory cell considered in the embodiments described in FIGS. 6 and 7, for which the memory cell has two complimentary bit lines viz. BL true & BL bar, only one of which will discharge depending on the data stored in the memory cell. There are other variants of memory cells, including with only one bit line which either discharges or does not discharge, and this is detected by a sense amplifier which then resolves and provides the output accordingly. For example, an embodiment described with reference to FIG. 6 may be readily used in case of such bit cells. The difference would be that instead of having BLT and BLB for both PROG-0 and PROG-1 columns, there would be only one BL for each of the two columns. For the PROG-0 column, BL would discharge while it would not discharge for PROG-1 column. Thus, the sense amplifier input will either discharge OR not discharge, depending upon which column amongst PROG-0 or PROG-1 is selected through the column mux device. The remaining functionality is the same as is the case for the embodiment in FIG. 6.

Also, a variation of an embodiment described above with reference to FIG. 7 is possible for bit cells with a single bit line. In one such embodiment, instead of two rows, one prog-0 and another prog-1, one row of prog-0 is sufficient. The control of whether the bit line of a particular memory IO discharges or not is purely on the basis of whether the pmos of the precharge device is turned off or not, dependent as usual on the data presented on the data input pin of that memory IO by the test pattern generator.

Furthermore, extension of embodiments described herein may be possible for multiport memories. So, for example, for a dual port (2 ports, both ports read and write), for an embodiment corresponding to FIG. 6, the additional row added would have a dual port memory cell, with programming done as mentioned for the single port memory. For column mux and precharge devices corresponding to BLT & BLB for both ports, similar selection logic dependent on atpg_enable, clock of respective port, column address of respective port and data input of respective port may be present. Similarly for embodiments corresponding to FIG. 7 and FIG. 8, there would be two rows of dual port cell, of which one word column in one row is Prog-0 and the same word column in another row is Prog-1. The column mux and precharge control logic of the BLT and BLB of both ports would have similar logic dependent on atpg_enable, clock of respective port, column address of respective port, and data input of respective port. Similarly, an embodiment may be extended to any number of ports.

An embodiment of a memory such as described above may be included on an integrated circuit such as a memory or controller such as a processor, and such an integrated circuit may be combined with one or more other integrated circuits or other components to form a system.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method, comprising:
activating a first test memory cell and a second test memory cell during a test mode;
causing a first logic value to be stored in the first test memory cell and causing a second logic value to be stored in the second test memory cell;
deactivating a data-storage memory cell during the test mode;
generating a test pattern on the first and second test memory cells such that the first test memory cell includes the first logic value and the second test memory cell includes the second logic value;
causing the first test memory cell to change a signal on a bit line from the first logic value to the second logic value, the second logic value being different from the first logic value; and
coupling the bit line to a sense amplifier after the signal on the bit line has the second logic value.

2. The method of claim 1, further including:
allowing the first test memory cell to change the signal on the bit line from a precharge logic level to another logic level; and
coupling the bit line to the sense amplifier after the signal on the bit line has the another logic level.

3. The method of claim 1, further including:
allowing the first test memory cell to change the signal on the bit line from a high logic level to a low logic level; and
coupling the bit line to the sense amplifier after the signal on the bit line has the low logic level.

4. The method of claim 1, wherein activating the first test memory cell includes activating a row including the first test memory cell.

5. The method of claim 1, wherein activating the first test memory cell includes activating a column including the first test memory cell.

6. The method of claim 1, wherein activating the first test memory cell includes activating a column including the first test memory cell and the data-storage memory cell.

7. The method of claim 1, further including configuring the first test memory cell to permanently store a logic one.

8. The method of claim 1, further including configuring the first test memory cell to permanently store a logic zero.

9. The method of claim 1, further including:
coupling a precharge signal to a first bit line coupled to the first test memory cell; and
uncoupling the precharge signal to a second bit line coupled to the first test memory cell.

10. The method of claim 1, further including:
coupling the first test memory cell to an output node;
uncoupling the first test memory cell from the output node; and
coupling the second test memory cell to the output node.

11. The method of claim 1, further including:
coupling the first test memory cell to an output node;
deactivating the first test memory cell; and
coupling the second test memory cell to the output node.

12. The method of claim 1, further including:
coupling the first test memory cell to an output node;
uncoupling the first test memory cell from the output node; and
coupling the second test memory cell to the output node.

13. A memory, comprising:
a memory array having rows of memory cells used for data storage and an additional row of memory cells used for programming;
wherein the additional row of memory cells includes first and second columns;
circuitry configured to store a first logic value in a memory cell of the first column and to store a second logic value different than the first logic value in a memory cell of the second column;
a first precharge circuit coupled to the first column;
a second precharge circuit coupled to the second column;
a first column multiplexer coupled to the first precharge circuit;
a second column multiplexer coupled to the second precharge circuit;
a first sense amplifier coupled to the first column multiplexer;
a second sense amplifier coupled to the second column multiplexer; and
selection circuitry configured to control the first and second column multiplexers so as to select a first voltage differential corresponding to a first desired logic value to be coupled to the first sense amplifier and to select a second voltage differential corresponding to a second desired logic value to be coupled to the second sense amplifier.

14. The memory of claim 13, further comprising an automatic test pattern generator (ATPG) word line generator configured in a test mode to select the additional row and to block word line generation of the rows used for data storage.

15. The memory of claim 14, wherein the ATPG word line generator is configured in a normal operation mode to select the rows used for data storage and to block word line generation of the additional row used for programming.

16. The memory of claim 13, wherein the memory array is comprised of dual port memory cells.

17. An electronic device, comprising:
a first test memory array located in a test row and having first bit columns;
a second test memory array located in the test row and having second bit columns;
a data-storage memory array located in a data row;
a test circuit configured to enable the first test memory array and the second test memory array, and to disable the data-storage memory array, during a test mode; and
wherein the test circuit is configured to select a first signal stored in the first test memory array for passage to a sense amplifier based upon a selection control signal having a first logic value matching a logic value of the first signal, and to select a second signal stored in the second test memory array for passage to the sense amplifier based upon the selection control signal having a second logic value matching a logic value of the second signal.

18. The electronic device of claim 17, wherein the first test memory array is configured to store logic ones as the first signal.

19. The electronic device of claim 17, wherein the first test memory array is configured to store logic zeros as the second signal.

20. The electronic device of claim 17, wherein the test circuit comprises a first series of bit lines coupled to the first test memory array, and a second series of bit lines coupled to the second test memory array; wherein the test circuit is configured to select the first signal by coupling the first test memory array to the first series of bit lines based upon the first logic value matching the logic value of the first signal; and wherein the test circuit is configured to select the second signal by coupling the second test memory array to the second series of bit lines based upon the second logic value matching the logic value of the second signal.

* * * * *